United States Patent
Scheer et al.

(10) Patent No.: US 9,085,045 B2
(45) Date of Patent: Jul. 21, 2015

(54) METHOD AND SYSTEM FOR CONTROLLING A SPIKE ANNEAL PROCESS

(71) Applicant: Tokyo Electron Limited, Tokyo (JP)

(72) Inventors: Steven Scheer, Austin, TX (US); Michael A. Carcasi, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 211 days.

(21) Appl. No.: 13/662,524

(22) Filed: Oct. 28, 2012

(65) Prior Publication Data

US 2013/0288487 A1    Oct. 31, 2013

Related U.S. Application Data

(60) Provisional application No. 61/652,127, filed on May 25, 2012, provisional application No. 61/556,126, filed on Nov. 4, 2011.

(51) Int. Cl.
| | |
|---|---|
| H01L 21/00 | (2006.01) |
| H01L 21/20 | (2006.01) |
| H01L 21/36 | (2006.01) |
| H01L 21/44 | (2006.01) |
| B23K 26/00 | (2014.01) |
| H01L 21/268 | (2006.01) |
| H01L 21/324 | (2006.01) |
| H01L 21/67 | (2006.01) |

(52) U.S. Cl.
CPC ........ B23K 26/0066 (2013.01); H01L 21/268 (2013.01); H01L 21/324 (2013.01); H01L 21/67103 (2013.01); H01L 21/67115 (2013.01)

(58) Field of Classification Search
None
See application file for complete search history.

(56) References Cited

U.S. PATENT DOCUMENTS

| | | | |
|---|---|---|---|
| 6,897,131 B2 | 5/2005 | Ramachandran et al. |
| 6,943,900 B2 | 9/2005 | Niu et al. |
| 7,115,479 B2 | 10/2006 | Liu et al. |
| 7,279,721 B2 | 10/2007 | Jennings et al. |
| 7,479,443 B2 | 1/2009 | Bauer et al. |

(Continued)

OTHER PUBLICATIONS

International Patent Application No. PCT/US2012/062434, International Search Report mailed Jan. 9, 2013, International Filing Date Oct. 29, 2012.

(Continued)

*Primary Examiner* — Mohsen Ahmadi
(74) *Attorney, Agent, or Firm* — Wood, Herron & Evans, LLP

(57) ABSTRACT

Provided is a method and system for controlling a spike anneal process on a substrate, comprising selecting one or more objectives, one or more absorbance layers, a technique of modifying absorption of the selected one or more absorbance layers, one or more wavelengths used in a heating device. A substrate modified with the selected technique of modifying absorption is provided. The spike anneal process is performed on the substrate using the selected heating device and selected spike anneal process variables. One or more of the spike anneal process variables, the selected technique of the modifying absorption, the selected one or more wavelengths, and/or the selected heating device are adjusted in order to meet the one or more objectives of the spike anneal process.

19 Claims, 12 Drawing Sheets

(56) References Cited

U.S. PATENT DOCUMENTS

| | | |
|---|---|---|
| 7,588,990 B2 | 9/2009 | Parihar et al. |
| 7,595,208 B2 | 9/2009 | Jennings et al. |
| 7,611,976 B2 | 11/2009 | Ma et al. |
| 7,772,134 B2 | 8/2010 | Jennings et al. |
| 2008/0029152 A1 | 2/2008 | Milshtein et al. |
| 2008/0045041 A1 | 2/2008 | Nakao |
| 2008/0102574 A1 | 5/2008 | Ito |
| 2010/0264123 A1 | 10/2010 | Jennings et al. |
| 2011/0108796 A1 | 5/2011 | Wang et al. |

OTHER PUBLICATIONS

Jung, B. et al., "Addressing Challenges in Lithography Using Sub-Millisecond Post Exposure Bake of Chemically Amplified Resists", Proc, SPIE, (2011).

http://www.sigmaaldriach.com/materials-science/material-science-products.html?TablePage=9540639.

Handbook of Laser Wavelengths, edited by Weber, Marvin J., published by CRC Press, 1999.

International Patent Application No. PCT/US2012/062434, International Preliminary Report on Patentability, issued May 6, 2014, International Filing Date Oct. 29, 2012.

METHOD AND SYSTEM FOR CONTROLLING A SPIKE ANNEAL PROCESS

CROSS-REFERENCE TO RELATED APPLICATIONS

Pursuant to 37 C.F.R. §1.78(a)(4), this application claims the benefit of and priority to prior filed Provisional Application Ser. No. 61/556,126 filed on Nov. 4, 2011 and 61/652,127 filed on May 5, 2012, which are expressly incorporated herein by reference.

BACKGROUND OF THE INVENTION

1. Field

The present application generally relates to manufacturing processes of semiconductor devices and more specifically to laser, or other light absorption based, spike annealing of structures on a substrate.

2. Related Art

Continued demand for smaller, more compact, faster, and more powerful chips forces the device geometries to scale down to and beyond the 100 nm node. Such aggressive downscaling in device geometries increases the short channel effects. This reduces the differentiation between $I_{on}$ (on state device current which is dependent on device type) and $I_{off}$ (off state device current or leakage currents), which reduction is essential for maintaining the device functionality. Thus the critical challenge in scaling device geometries is to maintain a distinction between $I_{on}$ and $I_{off}$.

Typical spike anneal is performed by subjecting a semiconductor substrate having implanted dopants to temperature treatment in a rapid thermal processing (RTP) system. The typical annealing profile using RTP involves ramping up to a target temperature, e.g. 1060° C., soaking the substrate at the target temperature for a period of time (soak time), and ramping down to a base temperature, e.g. 200° C. For spike anneal, high ramp rates, e.g., 10,000° C./sec or higher, and shorter than 1 sec or no soak time are desired to prevent excessive dopant diffusion. In addition to the tight temperature control requirement, gas composition in the annealing ambient can also need to be controlled. For example, the presence of oxygen has been found to be necessary in order to decrease the evaporation or out-diffusion of implanted dopants such as boron and arsenic, but too much oxygen in the annealing ambient results in oxygen modified diffusion (OED) and limits the creation of shallow junctions, particularly when dopants such as boron are used.

Current technology involves ion implantation followed by a rapid thermal spike annealing process. The main parameters in any spike annealing process are the peak temperature, and dwell time. A measure of spike sharpness, $t_R$, is defined as the time spent by the substrate within 50° C. of peak temperature. Higher peak temperature has the primary effect of causing increased dopant activation, hence causing reduced residence time and increased $I_{on}$. Different devices have different requirements of dopant activation and hence different choices for peak temperature. For the same peak temperature, an increase in dwell time has the primary effect of increasing dopant diffusion, hence increasing the leakage currents. A common technology has made use of a $CO_2$ laser (10.6 μm wavelength). Because of the far infrared (FIR) wavelength, absorption is induced only by free carrier generation, which requires either heavily doped substrates or thermal carrier generation to create the free carriers. With regards to heavily doped silicon substrates, resistivity between ~0.005 to ~0.020 ohm-cm for p-type is needed to induce free-carrier absorption by exposure to a $CO_2$ laser (10.6 μm wavelength). With regards to thermal carrier generation, temperatures around 400° C. are typically required to induce free-carrier absorption by exposure to a $CO_2$ laser (10.6 μm wavelength). This temperature could be established by a traditional resistance based hot plate or by using a second pre-heat laser (to heat local area in front of the scanning $CO_2$ laser beam. Because of the absorption properties of the locally doped or pre-heated surface, the $CO_2$ anneal produces a localized heating within only the top one-third of the substrate, which leaves the bottom two-thirds of the substrate essentially as a cold sink. This cold sink allows for very quick thermal quenching of the elevated temperature induced by the laser exposure, thus, the millisecond bake process.

The main effort behind spike anneal for current ion implant technology is to reduce dwell time without compromising on the required level of dopant activation. When looking to apply similar spike anneal processes to photolithography resist chemistry applications, desirable in the art are methods and systems that can achieve the peak temperature at a short controllable dwell time without making use of heavily doped substrates to get absorption or without making use of pre-heat thermal treatments that would thermally de-protect or thermally degrade resist chemistries (when using traditional resistance based hot plate at long times) or in the case of a pre-heat laser beam process, raise the temperature of the local substrate higher than the target spike peak temperature for resist applications.

SUMMARY

Provided are a method and system for controlling a spike anneal process on a substrate, comprising selecting one or more objectives, one or more absorbance layers, a technique of modifying absorption of the selected one or more absorbance layers, one or more wavelengths for a heating device, for example, one or more lasers or other light devices as the heating device. A substrate modified with the selected technique of modifying absorption is provided. The spike anneal process is performed on the substrate using the selected heating device and selected spike anneal variables. One or more of the spike anneal process variables, the selected technique of the modifying absorption, the selected one or more wavelengths, and/or the selected laser, or other light device are adjusted in order to meet the one or more objectives of the spike anneal process.

DETAILED DESCRIPTION OF EXEMPLARY EMBODIMENT(S)

In order to facilitate the description of the present invention, a semiconductor substrate is utilized to illustrate applications of the concept. The methods and processes equally apply to other workpieces such as a wafer, disk, memory or the like. In several figures, laser spike anneal processing is used as an example to describe elements of the method and system of the present invention. It should be noted that other heating devices such a flash lamp, an arc lamp, a light-emitting diode (LED) or the like can also be used.

Figure 1:
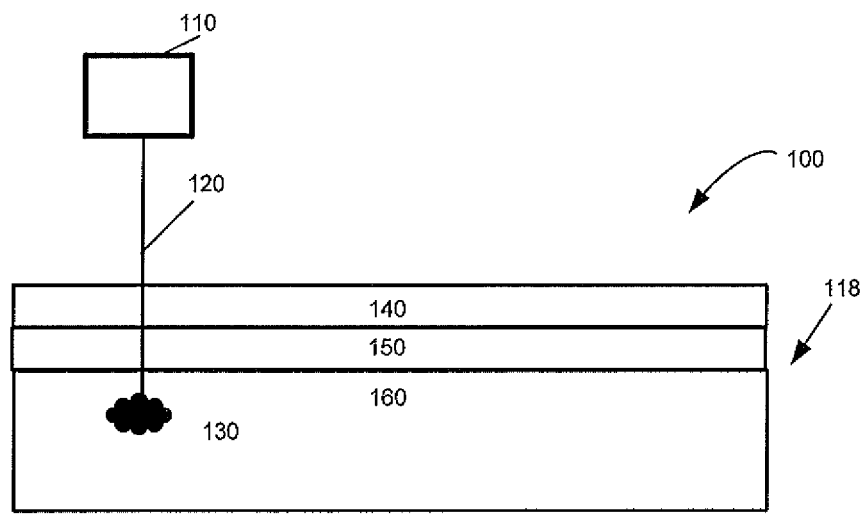
FIG. 1 is an architectural diagram illustrating a prior art method of spike anneal for a post-exposure bake (PEB) processing using a standard resist, standard bottom anti-reflective coating (BARC), and a standard doped silicon substrate.

FIG. 1 is an architectural diagram 100 illustrating a prior art method of spike anneal for post-exposure bake (PEB) processing using a standard resist 140, a standard bottom anti-reflective coating (BARC) 150, a standard doped silicon layer 160, and a far infrared (FIR) laser device 110. The FIR laser device 110 projects the laser beam 120 onto a surface of the substrate 118 utilizing the absorption of the various layers of the substrate for generating the heat 130 to perform the spike anneal. Prior art PEB processing spike annealing systems have extensively used heavily doped silicon (Si) substrates where the typical resistivity is between 0.005 to 0.02 ohms-cm for p-type substrates, to induce free-carrier absorption. The typical heating device is a $CO_2$ laser at about 10.6 μm wavelength. As mentioned above, only the doped area is undergoing substantial absorption at the 10.6 μm wavelength thereby producing a localized heating of approximately the top one-third of the substrate, comprising the standard resist 140 layer, BARC 150, and the surface of the standard doped silicon layer 160. This process leaves the bottom two-thirds of the substrate essentially as a cold sink. The cold sink effect allows for very quick thermal quenching of elevated temperatures induced by the laser, or other light based exposure, thus making possible a millisecond PEB. Because of being able to bake in the millisecond regime, the heating (ramp rate) with the $CO_2$ laser, or other light based exposure, enables annealing significantly above traditional PEB temperatures without adverse effects to the photoresist film.

A diode laser with a wavelength of ≥1 μm wavelength has been proposed. However, undoped silicon native absorbance at this wavelength is not high enough to produce localized heating. Instead, the laser energy is absorbed throughout a significant part of the substrate, which in turn heats up the entire silicon substrate almost universally. Subsequent cooling by convection can be required, which leads to longer temperature exposures and negates some of the value of the technique. As mentioned above, there is a need for a method and system that (a) do not require a heavily doped substrate, (b) move the critical absorption media of the spike anneal process to a definable substrate layer or layers rather than solely relying on the substrate for absorption and heating, and (c) that ensure short and controllable dwell time due to the rapid thermal quenching of the substrate, with the substrate acting as a cold sink.

Figure 2A:
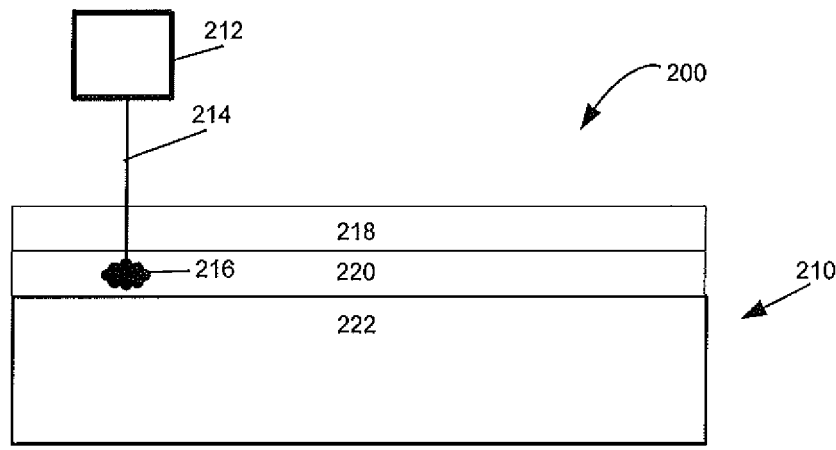
FIG. 2A depicts an exemplary architectural diagram of a substrate comprising at least a standard layer of resist, a modified BARC, and a standard silicon substrate in a spike anneal PEB processing in an embodiment of the present invention.

FIG. 2A depicts an exemplary architectural diagram 200 of a substrate 210 comprising at least a standard layer of resist 218, a modified BARC 220, and a standard silicon substrate 222 in a spike anneal PEB processing in an embodiment of the present invention. The modified BARC 220 is the absorbance layer where a standard BARC is modified to have standard process absorbance at critical lithography wavelengths and is highly absorbing at another, secondary wavelength while not affecting other process critical chemical properties such as etch selectivity, Young's modulus, and the like. The heating device, such as a laser or other light based device 212, projects a beam 214 at a selected wavelength based on the spike anneal application, utilizing the absorption of the modified BARC 220 for generating the heat 216 to perform the spike anneal. The heating device can be a laser, a flash lamp, an arc lamp, light-emitting diode (LED) or the like. In an embodiment, the layer underneath the resist is a modified organic BARC 220. In another embodiment, the layer underneath the resist comprises silicon-containing anti-reflective coating (SiARC) and an organic planarization layer (OPL). In yet another embodiment, the layer underneath the resist comprises an underlayer, a SiARC, and an OPL. Other combinations of layers underneath or above the resist can also be used. Further details of the absorbance layer, the heating device such as the laser or other light based device, and operating variables will be discussed in the description of the methods of spike anneal applications in connection with FIGS. 9 and 10.

Figure 2B:
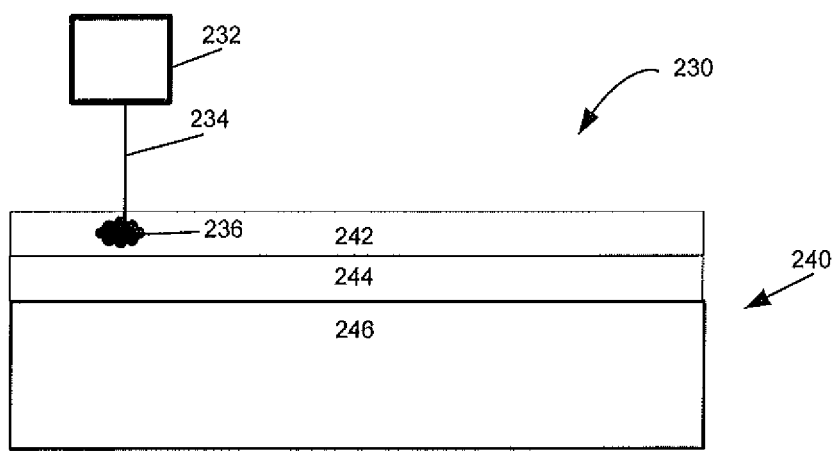
FIG. 2B depicts an exemplary architectural diagram of a substrate comprising at least a layer of modified resist, a standard BARC, and a standard silicon substrate in a spike anneal PEB processing in an embodiment of the present invention.

FIG. 2B depicts an exemplary architectural diagram 230 of a substrate 240 comprising at least a layer of modified resist 242, a standard BARC 244, and a standard silicon substrate 246 in a spike anneal PEB processing in an embodiment of the present invention. The modified resist 242 is the absorbance layer where the resist is modified to be highly absorbing at another, secondary wavelength that is different from one or more critical wavelengths for a lithography process while not affecting other process critical chemical properties such as etch selectivity, Young's modulus, and the like. The heating device, such as a laser or other light based device 232 projects a beam 234 at a selected wavelength based on the spike anneal application, utilizing the absorption of the modified resist 242 for generating the heat 236 to perform the spike anneal. The heating device can be a laser, a flash lamp, an arc lamp, light-emitting diode (LED) or the like. In an embodiment, the layer underneath the resist is a modified organic BARC 220. In another embodiment, the layer underneath the resist comprises silicon-containing anti-reflective coating (SiARC) and an organic planarization layer (OPL). In yet another embodiment, the layer underneath the resist comprises an underlayer (UL), a SiARC, and an OPL. Other combinations of layers underneath or above the resist can also be used. Further details of the absorbance layer, the heating device such as a laser or other light based device, and operating variables will be discussed in the description of the methods of spike anneal applications in connection with FIGS. 9 and 10.

Figure 2C:
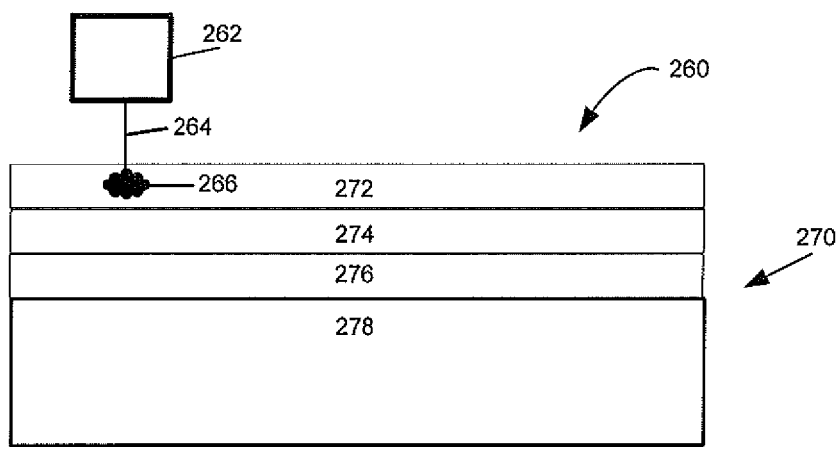
FIG. 2C depicts an exemplary architectural diagram of a substrate comprising at least a modified top anti-reflective coating (TARC) or a modified sacrificial layer, a standard layer of resist, a standard BARC, and a standard silicon substrate in a spike anneal PEB processing in an embodiment of the present invention.

FIG. 2C depicts an exemplary architectural diagram 260 of a substrate 270 comprising at least a modified top anti-reflective coating (TARC) 272 or a modified sacrificial layer 272, a standard layer of resist 274, a standard BARC 276, and a standard silicon substrate 278 in a spike anneal PEB processing in an embodiment of the present invention. The top anti-reflective coating or the modified sacrificial layer 272 is the absorbance layer and is modified to have standard or no absorbance at critical lithography wavelengths but highly absorbing at another, secondary wavelength(s) while not affecting other process critical chemical properties such as etch selectivity, Young's modulus, and the like. The heating device, such as a laser or other light based device 262 projects a beam 264 at a selected wavelength based on the spike anneal application, utilizing the absorption of the modified TARC 272 for generating the heat 266 to perform the spike anneal. The heating device can be a laser, a flash lamp, an arc lamp, light-emitting diode (LED) or the like.

In an embodiment, the layer 276 underneath the resist is a modified organic BARC 220. In another embodiment, the layer 276 underneath the resist comprises silicon-containing anti-reflective coating (SiARC) and an organic planarization layer (OPL). In yet another embodiment, the layer 276 underneath the resist comprises an underlayer (UL), a SiARC, and an OPL. Other combinations of layers underneath or above the resist can also be used. Further details of the absorbance layer, the heating device, such as a laser or other light based device, and operating variables will be discussed in the description of the methods of spike anneal applications in connection with FIGS. 9 and 10. In another embodiment, two or more layers in a substrate can be modified to function as the one or more absorbance layers in a spike anneal application. For example, the absorbance of two layers of a photolithography stack can be modified to function as the absorbance layers. Another example is a TARC layer combined with a sacrificial layer. The absorbance of other combinations of layers in a substrate can be modified to provide the desired absorbance for a spike anneal application.

Figure 3A:
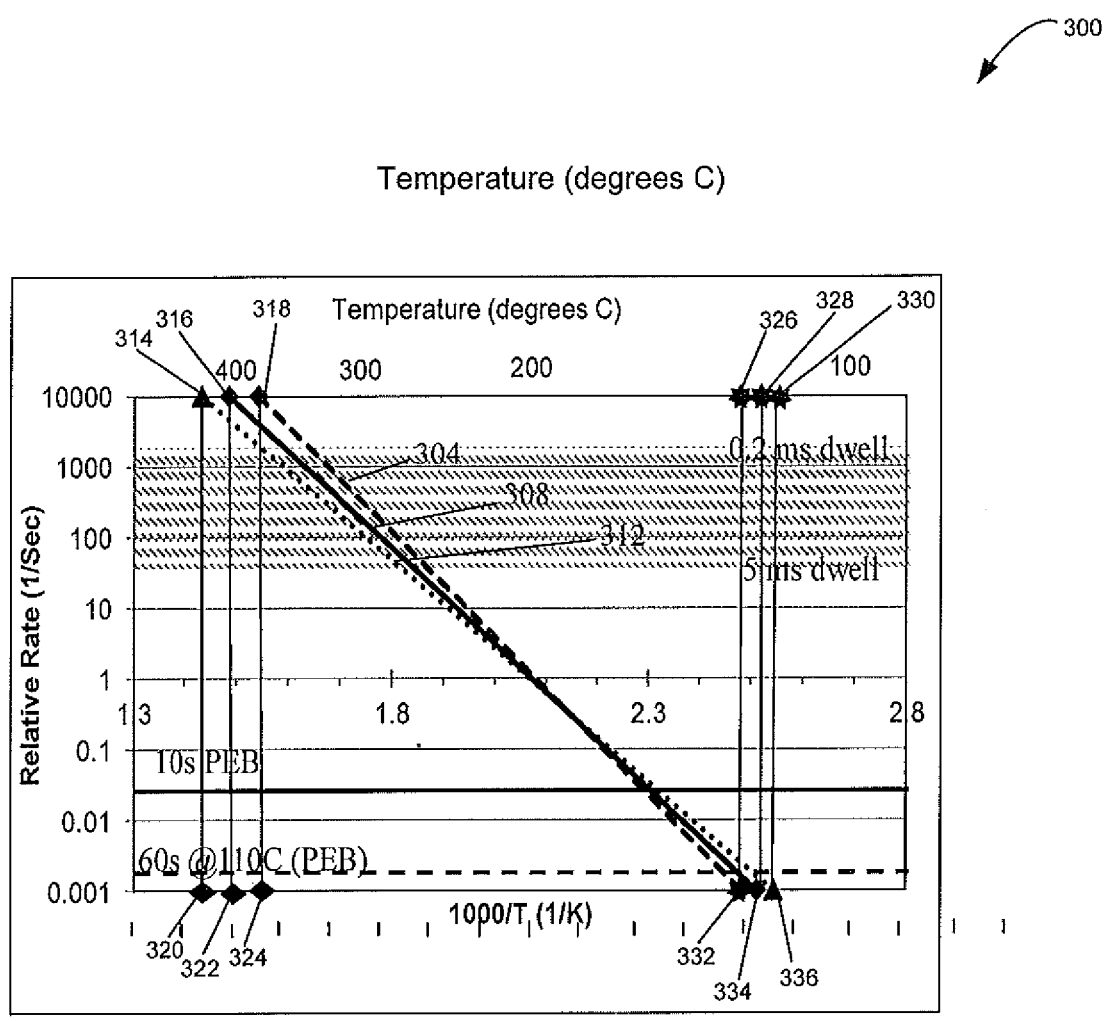
FIG. 3A is an exemplary graph of spike anneal system relative rate of deprotection, diffusion, and acid quench versus temperature and reciprocal of the temperature of the spike anneal PEB processing in an embodiment of the present invention.

FIG. 3A is an exemplary graph 300 of spike anneal relative rate of deprotection curve 304, diffusion curve 308, and acid quench curve 312 as a function of the temperature or reciprocal of the temperature of the spike anneal PEB processing in an embodiment of the present invention. The bottom X-axis depicts the reciprocal of the absolute temperature in Kelvin. The Y-axis depicts the relative rate (or the reciprocal of relative dwell time of the spike anneal) from 0.001 $s^{-1}$ to 10,000 $s^{-1}$. Sections of Y-axis include 0.2 ms dwell, 5 ms dwell, 10 s PEB, and 60 s @110 C PEB. The top X-axis depicts the temperature of the spike anneal in degrees C. The graph 300 includes a deprotection curve 304, a diffusion curve 308, and an acid quench curve 312. Deprotection is the amount of deblocking of the resin and varies according to the resist chemistry. Diffusion is the process in which the portion of photo-acid generators that have been converted by photolysis to free acids diffuse away from their original photolysis location and varies according to the resist chemistry. Acid quench refers to the chemical transformation of acids created from the photolysis reaction into salts as they are chemically neutralized by bases in the resist matrix and varies according to the resist chemistry. Dwell time can be approximated from the laser scan axis beam width divided by the scan velocity of the laser beam passing through the substrate or is often defined as the time spent within a certain proximity of peak temperature.

Still referring to FIG. 3A, deprotection curve 304 is a line sloping downward from a relative rate of 10,000 $s^{-1}$ and temperature of about 380 degrees C. (point 318) and where the reciprocal temperature of the spike anneal is 1.7 (point 324) ending at a relative rate of 0.001 $s^{-1}$ (point 332); the diffusion curve 308 is a line sloping downward beginning from a relative rate of 10,000 $s^{-1}$, temperature of about 405 degrees C. (point 316), and the reciprocal temperature of the spike anneal is 1.6 $K^{-1}$ (point 322), a temperature of about 146 degrees C. (point 326) to the an ending relative rate of 0.001 $s^{-1}$, temperature of about 140 degrees C. (point 328), and reciprocal temperature of the spike anneal at 2.6 $K^{-1}$ (point 334). The acid quench curve 312 is a line sloping downward beginning from a relative rate of 10,000 $s^{-1}$, temperature of about 415 degrees C. (point 314), and the reciprocal temperature of the spike anneal is 1.4 $K^{-1}$ (point 320) to an ending relative rate of 0.001 $s^{-1}$, temperature of about 125 degrees C. (point 330), and reciprocal temperature of the spike anneal at 2.5 $K^{-1}$ (point 336) The three curves depict the kinetic competition between photoacid diffusion, deprotection, and quenching: as the PEB temperature increases, the competition window between diffusion and deprotection becomes broader.

Figure 3B:
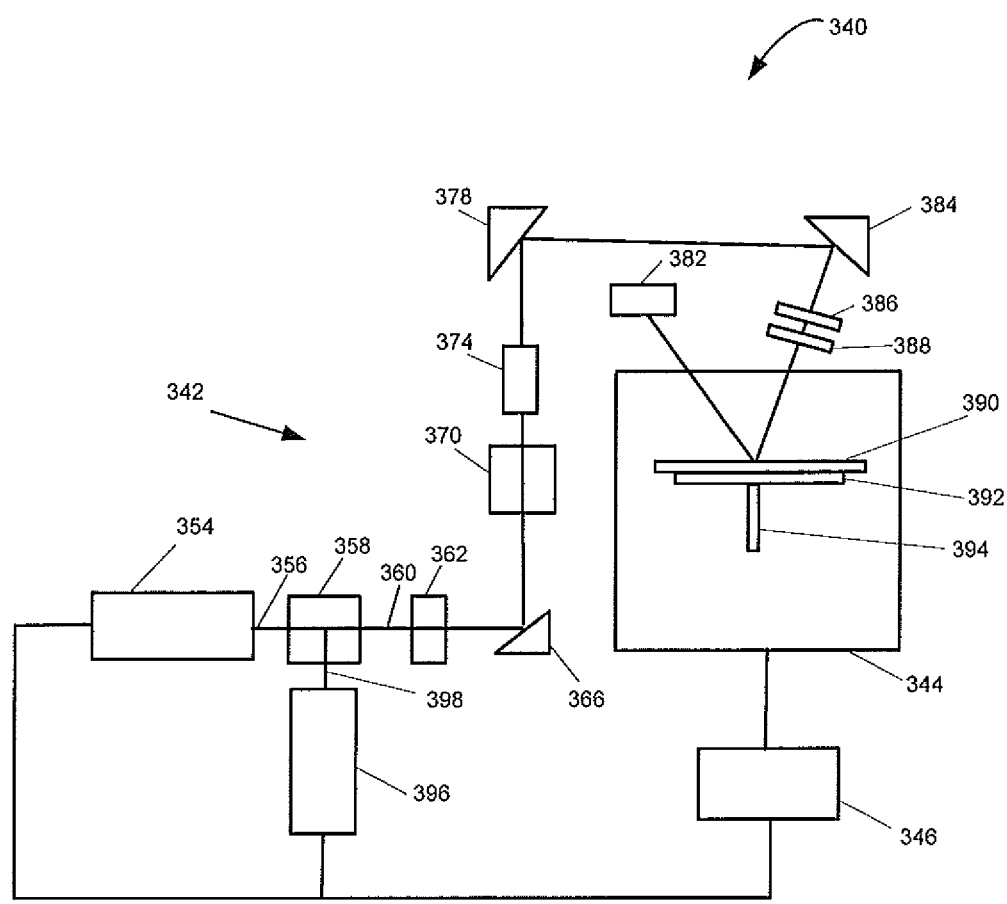
FIG. 3B is an exemplary architectural diagram of a spike anneal system for PEB processing in an embodiment of the present invention.

FIG. 3B is an exemplary architectural diagram 340 of a spike anneal system 342 for PEB processing in an embodiment of the present invention. A first laser or light based device 354, for example, a hydrogen fluoride laser or other light based device, provides a first laser, or other light based beam 356 that goes to a beam splitter 358 and generates a first reference beam (not shown) that is used for reference and other purposes and a first principal beam 360. The first principal beam 360 of the first laser or other light based device 354 goes through a shutter 362 to provide the required dimensions of the laser, or other light based, beam, for example, beam width, required for the spike anneal application. The laser, or other light based, beam 360 is directed by a first reflective optical component 366 through an attenuator 370 to bring the beam to the desired power and through a second shutter 374 and is directed by a second reflective optical component 378 and a third reflective optical component 384 through a long beam lens 386 and a short beam lens 388 onto the substrate 390 through a porthole or window of the processing chamber 344. The substrate 390 reflects the laser, or other light based, beam 360 to a reflected power meter 382 that measures the power after the laser, or other light based, beam has been used to perform the spike anneal processing. The reflected power meter 382 may be positioned outside of the processing chamber 344 by directing the reflected beam 360 through a porthole or window.

Still referring to FIG. 3B, the substrate 390 is positioned on top of a chuck 392 and a motion control system 394 is configured to move the substrate in a direction and speed required by the spike anneal application. A control system 342 controls the variables of the spike anneal application and receives, processes, and transmits measurements and information from processors and other process tools in order to implement a recipe for the spike anneal system 352. A second laser device 396, for example, a HeNe laser device, projects a second beam 398 to the beam splitter 358 and generates a second reference beam (not shown) that is used for reference and other purposes and a second principal beam 360. The second principal beam 360 of the second laser or light based device 396 is transmitted through the optical components and directed to the structure on substrate 390 like the first principal beam 360 of the first laser device 354.

Figure 4:
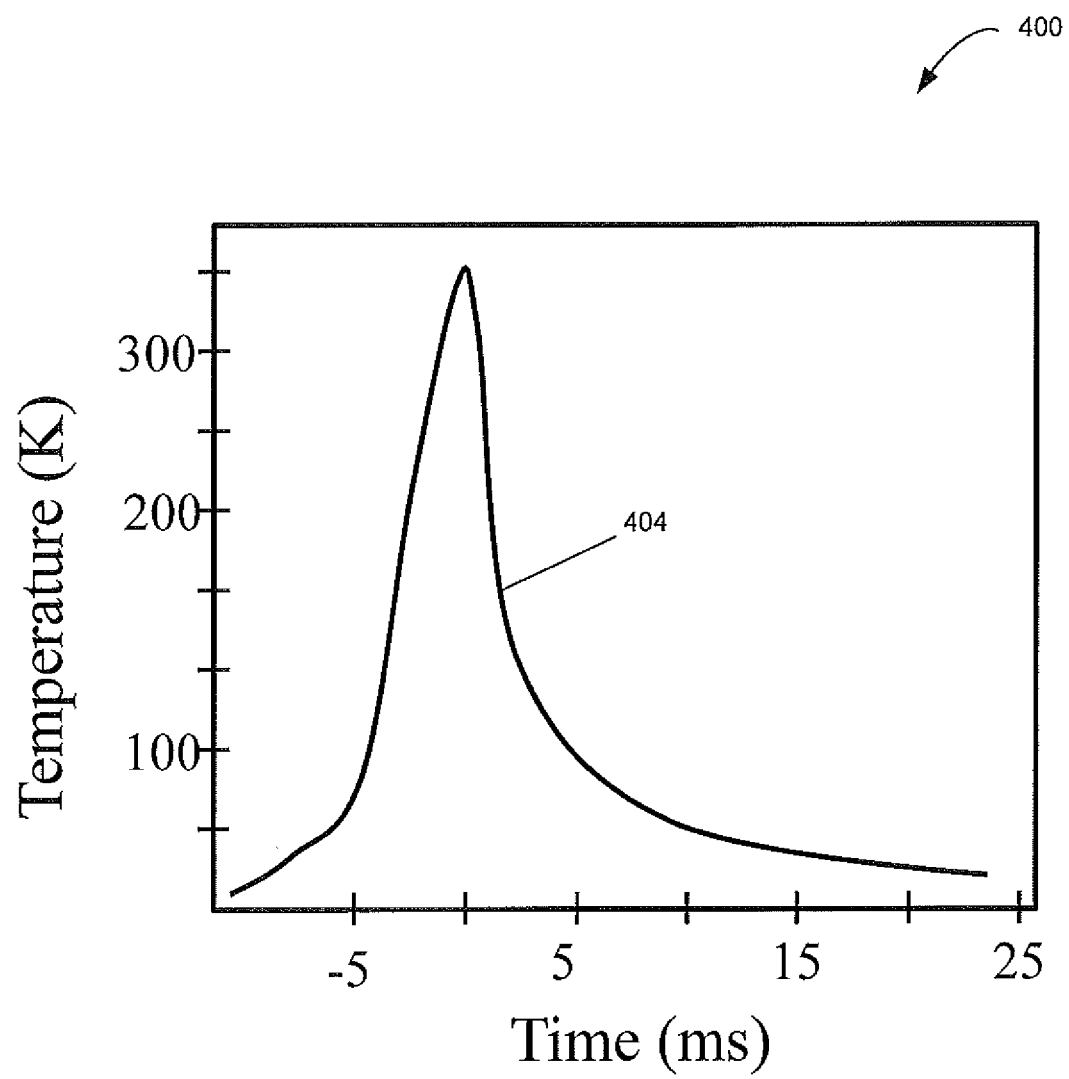
FIG. 4 is an exemplary graph of surface temperatures of the absorbance layer(s) as a function of dwell time of a laser, or other light absorption based device in a spike anneal application, in an embodiment of the present invention.

FIG. 4 is an exemplary graph 400 of the surface temperature of the absorbance layer as a function of laser dwell time for a laser spike anneal application in simulations, in an embodiment of the present invention. The curve 404 depicts the temperature of the absorbance layer of a substrate as a function of laser dwell time in milliseconds, with zero time coinciding with peak temperature in the X-axis. Dwell time is approximated by dividing the laser beam scan axis width by the scan speed. As mentioned above, the heating device can be a laser, a flash lamp, an arc lamp, light-emitting diode (LED) or the like.

Figure 5:
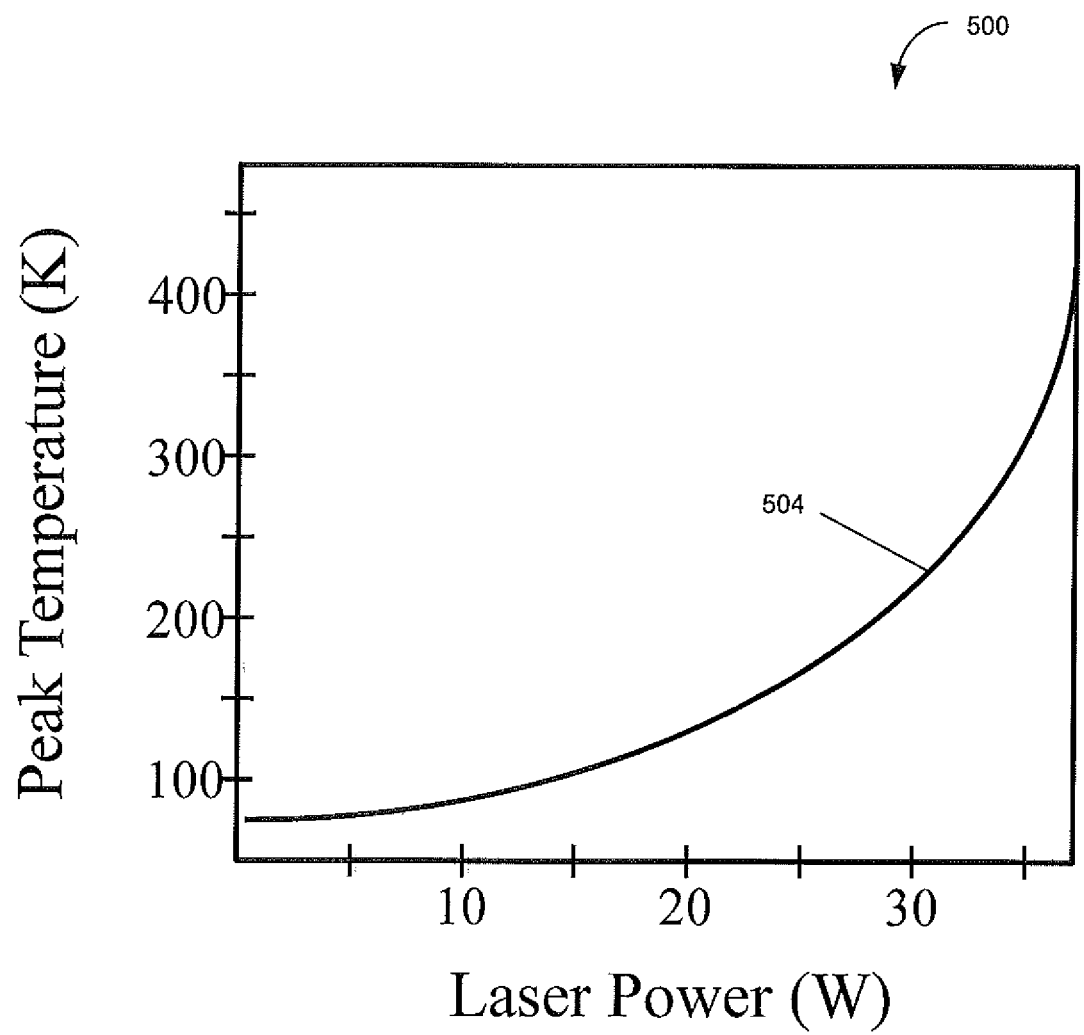
FIG. 5 is an exemplary graph of simulated peak temperature as a function of laser power of a laser device in an embodiment of the present invention.

FIG. 5 is an exemplary graph 500 of simulated peak temperature of a PEB laser spike anneal as a function of laser power in an embodiment of the present invention. As the laser power measured in watts increases in curve 504, the simulated peak temperature of the spike anneal goes up in a manner that resembles a parabolic curve. This is an important correlation as the cost of power is a significant item in the cost of ownership of a spike anneal application.

Figure 6:
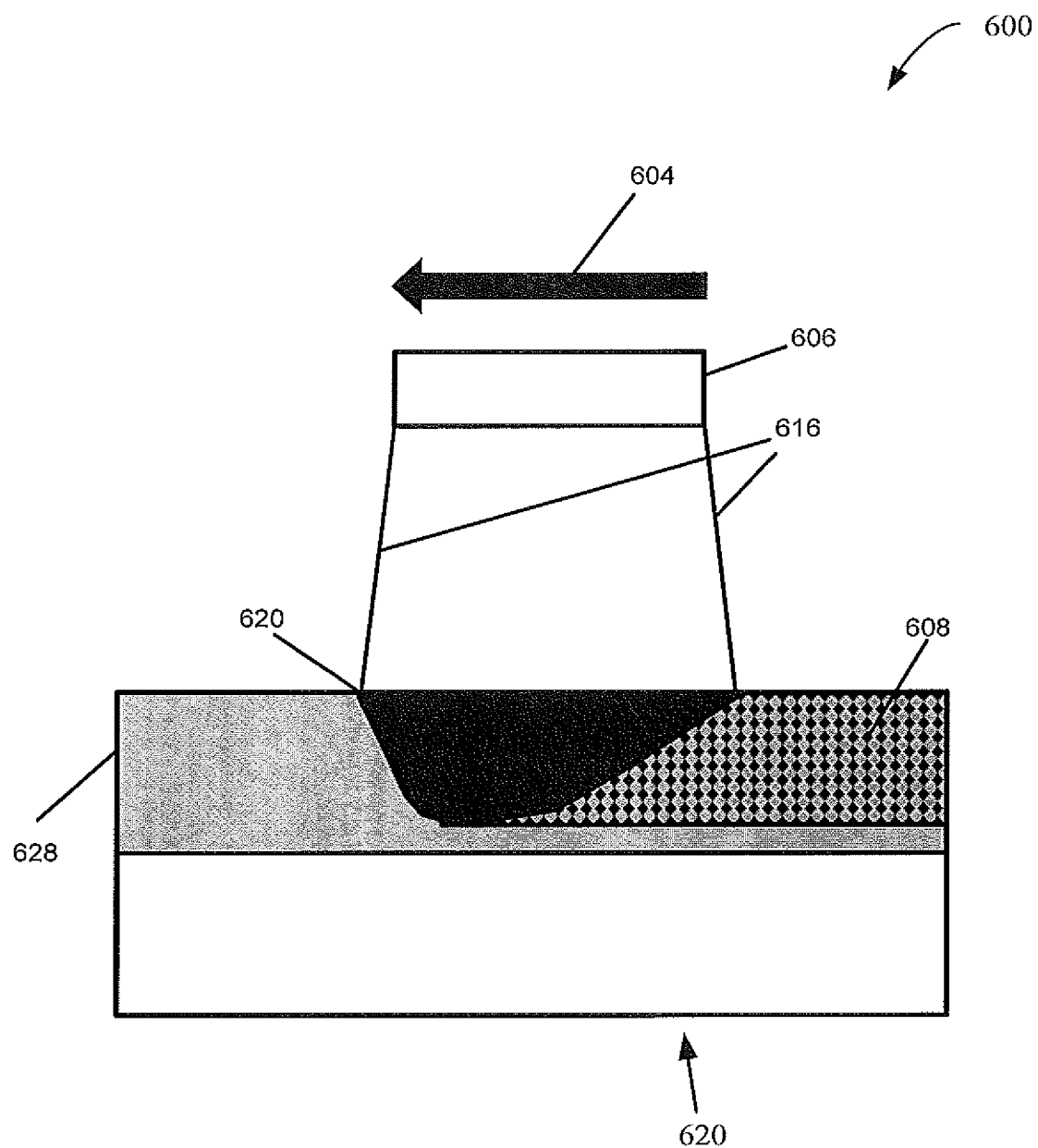
FIG. 6 is an exemplary schematic of laser spike annealing depicting how the laser rapidly heats up the absorbance layer which rapidly cools as the laser beam passes.

FIG. 6 is an exemplary schematic diagram 600 of laser spike annealing depicting how the laser beam 616 rapidly heats up the absorbance layer 628 which subsequently rapidly cools down as the laser beam 616 passes. The laser device 606 or the substrate 620 moves in a direction 604 determined by the recipe of the spike anneal application. The laser device 606 generates a laser beam 616 that is directed to the substrate 620 where an absorbance layer 628 has been modified to have the absorbability required for the spike anneal application. As mentioned above, the absorbance layer can be a modified BARC, a modified resist, a modified TARC, or a modified sacrificial layer. In another embodiment, the absorbance layer comprises two or more of a modified BARC, a modified resist, a modified TARC, or a modified sacrificial layer. In another embodiment, the absorbance can be the top layer or lower layer of the substrate. As depicted in the schematic, the absorbance layer 628 goes through the spike anneal process reaching the peak temperature rapidly as depicted in FIG. 4 and becomes the spike-annealed absorbance layer 608. The rapid cooling is achieved by the modification of the absorbance layer which enables the rapid ramp up to the peak temperature with the rest of the substrate acting as a cold sink. As mentioned above, in an embodiment, the layer underneath the resist can be a modified organic BARC 220. In another embodiment, the layer underneath the resist can be silicon-containing anti-reflective coating (SiARC) and an organic planarization layer (OPL). In yet another embodiment, the layer underneath the resist can be an underlayer (UL), a SiARC, and an OPL. Other combinations of layers underneath or above the resist can also be used.

Figure 7:
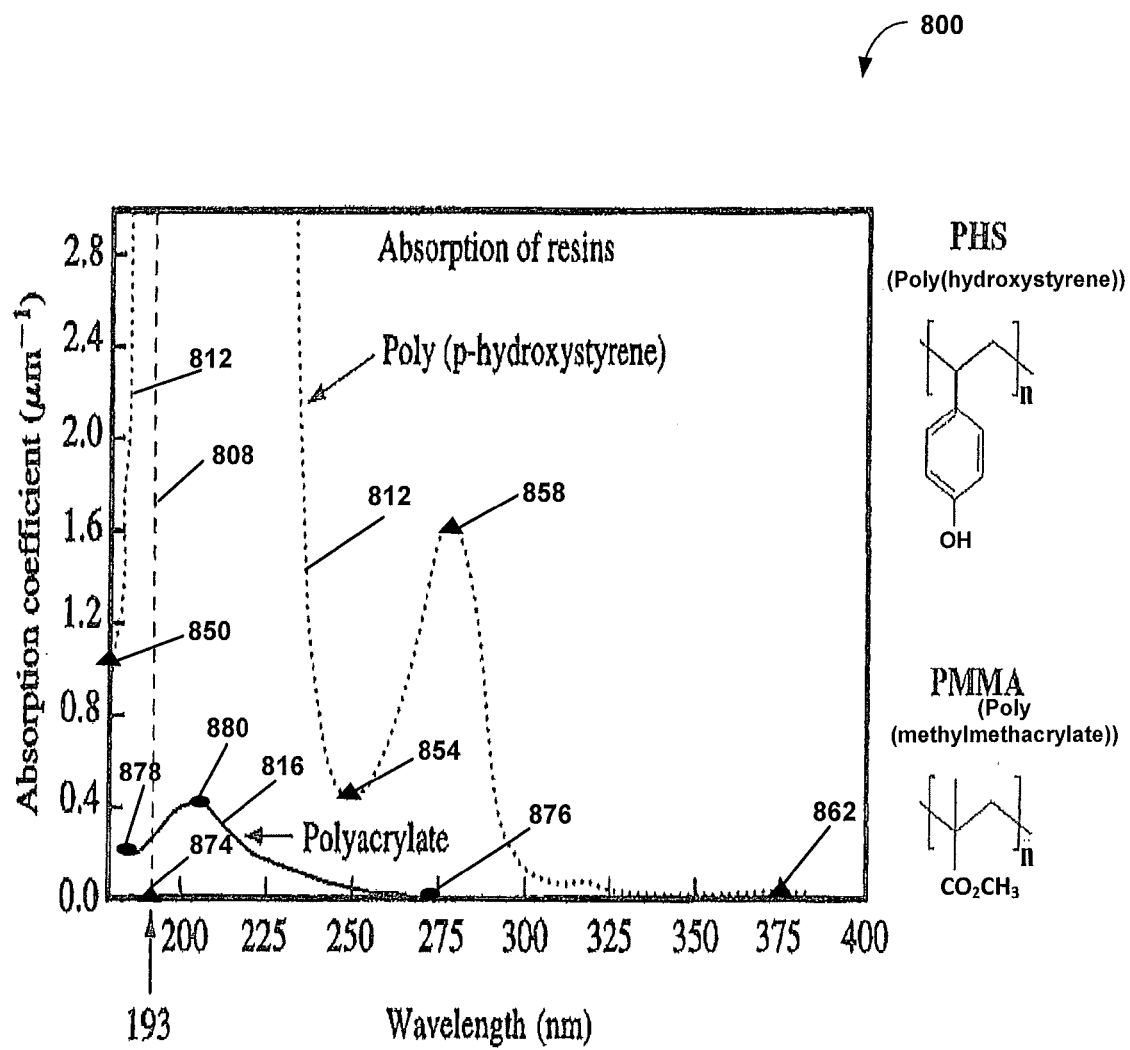
FIG. 7 is an exemplary graph of the absorption coefficient of resins as a function of wavelength in a spike anneal PEB application using a laser device in an embodiment of the present invention.

FIG. 7 is an exemplary graph 800 of the absorption coefficient of resins as a function of wavelength in a spike anneal PEB application, in an embodiment of the present invention. The design of a spike anneal system includes selecting a wavelength for the laser or other light based device which is used, as mentioned above, to project a laser or other light based device beam onto the substrate. When the laser or other light based device beam passes through the substrate, the laser, or other light based device beam will lose intensity due to two processes: The light can be absorbed by the absorbance layer or the light can be scattered (i.e., the photons can change direction) by the substrate. The absorption equation is:

$$I = I_o e^{-\alpha x} \qquad \text{Equation 1}$$

1. where I is the measured intensity of the laser or other light based device beam,
   1. $I_0$ is the incident intensity of the laser or other light based device beam,
   2. α is the absorption coefficient of the absorbance layer, and
   3. x is the thickness of the absorbance layer.

With reference to FIG. 7, the curve of Poly (PHS—Polyhydroxystyrene) (Poly) 804 shows the absorption coefficient of about 1.00 at a wavelength of 185 nm, indicated by point 850. The Poly absorption coefficient curve 812 rises very sharply with increased wavelengths until at 193 nm, indicated by line 808 and by point 874, the absorption coefficient reaches a maximum that is outside the range of the graph. Beyond a wavelength of 193 nm, the Poly absorption coefficient curve 812 drops abruptly until a first minimum point, indicated by point 854, after which it rises to an absorption coefficient of 1.58, indicated by point 858, at about 275 nm and drops abruptly again and settles at an absorption coefficient of about 0.0 at 375 nm, indicated by point 862. With reference to the curve for Polyacrylate (PMMA—polymethylmethacrylate) (PMMA) 816, the PMMA absorption coefficient curve starts at about 0.20, indicated by point 878, at 188 nm wavelength and rises to a maximum of about 0.45, indicated by point 816, at 212 nm, then gradually decreases until hitting an absorption coefficient of about 0.0 at about 275 nm, indicated by point 876. The graph 800 exemplifies the data used in selecting materials that can be used to enhance the absorption coefficients of the absorbance layer for the spike anneal application. Most resist platforms have little to no absorbance at wavelengths higher than 500 nm. As shown in the curve Poly (PHS—Polyhydroxystyrene) 804 and the curve PMMA 816, the cut-off wavelengths are 375 nm 876 and 275 nm 862 respectively. This allows for a wide choice of dyes and other compounds that can meet the requirement of a material that has little to no absorbance at lithography critical wavelengths or ranges of wavelengths and highly absorbing at a secondary wavelength or ranges of wavelengths without affecting other process chemical properties, (for example etch selectivity, Young's modulus, and the like.)

Figure 8:
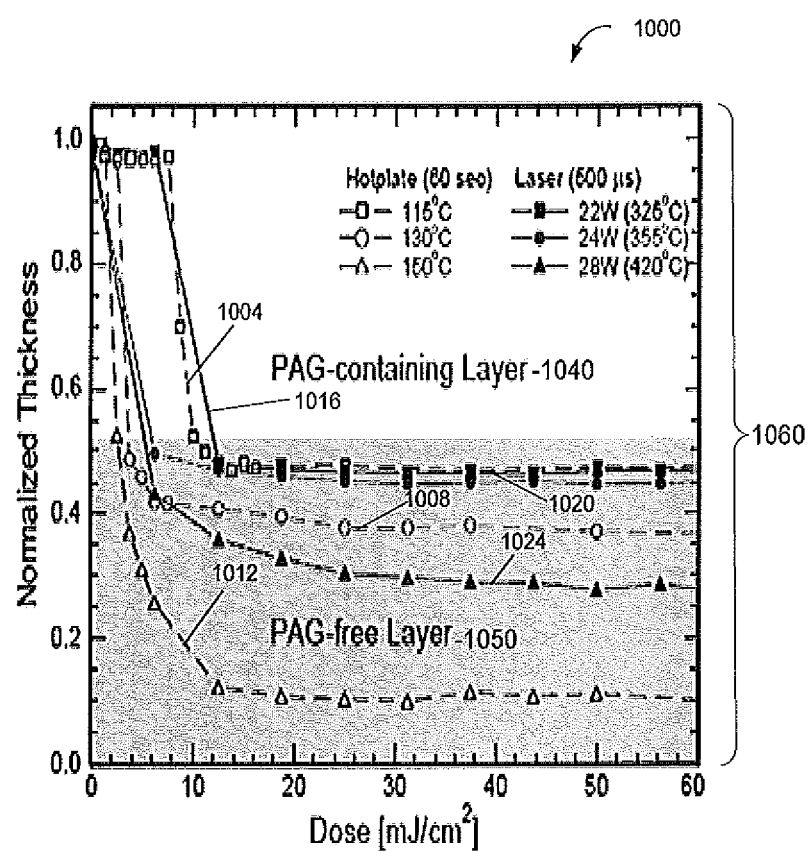
FIG. 8 is an exemplary graph of the acid diffusion observed under several spike anneal laser power conditions making use of well-established normalized bilayer experimental techniques as discussed in Jung, B., Ober, C., Thompson, M., Younkin, T., Chandhok, M., "ADDRESSING CHALLENGES IN LITHOGRAPHY USING SUB-MILLISECOND POST EXPOSURE BAKE OF CHEMICALLY AMPLIFIED RESISTS", Proc, SPIE, (2011), which is included herein in its entirety by reference.

FIG. 8 is an exemplary graph of the acid diffusion observed under several spike anneal laser power conditions making use of well-established normalized bilayer experimental techniques. Three laser graphs with spike anneal dwell time of 500 μs include a graph 1016 at 22 W power and a peak temperature of 325 degrees C., another graph 1020 at 24 W power and a peak temperature of 355 degrees C., and yet another graph 1024 at 28 W power and a peak temperature of 420 degrees C. Three hotplate graphs with a 60 s dwell time include a first graph 1004 at a peak temperature of 115 degrees C., a second graph 1008 at a peak temperature of 115 degrees C., and a third graph 1012 at a peak temperature of 150 degrees C. The six graphs can be used to primarily characterize where the acid diffusion is comparable, or even lower, under laser spike anneal PEB versus hot plate PEB. The bilayer data is obtained using a 193 nm resist with 5 wt % triarylsulfonium hexafluoroantimonate salt (THS) photo acid generator (PAG) loading on the top layer (PAG-containing layer in the graph 1040) and no THS PAG loading in the bottom layer (PAG-free layer in the graph 1050). The X-axis in the dose expressed in mJ/cm$^2$ and the Y-axis is the normalized thickness of the bilayer resist.

Diffusion of generated acids in the bilayer resist 1060 after the PEB processes proceeds from the PAG-containing layer 1040 into the PAG-free layer 1050. Diffusion of the generated acids into the PAG-free layer 1050 can be quantified by using the amount of subsequent thickness loss from a development step as a measure of length of acid diffusion. The length of acid diffusion is used as a measure of acid diffusivity at varying temperatures. In the case of laser spike anneal, the temperature is correlated to the laser power. Using the hot plate PEB as depicted with the 115° C. graph 1004, no substantive diffusion of the generated acids was observed at 115 degrees C. By increasing the temperature to 130 degrees C. as depicted in the 130° C. graph 1008, the acid diffusion increased until at about 150 degrees C. depicted with the 150° C. graph 1012, nearly all of the PAG-free film was lost. Under the laser spike anneal PEB, no substantial acid diffusion occurs at 22 W (~325° C.), depicted by the graph 1016 up to 24 W (~355° C.) depicted by graph 1020. Substantial acid diffusion occurs above 28 W (~420° C.) graph 1024, similar to but less than the hot plate PEB acid diffusion. For more details on acid diffusion observed under several spike anneal laser power conditions making use of well-established normalized bilayer experimental techniques, refer to Jung, B., Ober, C., Thompson, M., Younkin, T., Chandhok, M., "ADDRESSING CHALLENGES IN LITHOGRAPHY USING SUB-MILLISECOND POST EXPOSURE BAKE OF CHEMICALLY AMPLIFIED RESISTS", Proc, SPIE, (2011), which is included herein in its entirety by reference.

Figure 9:
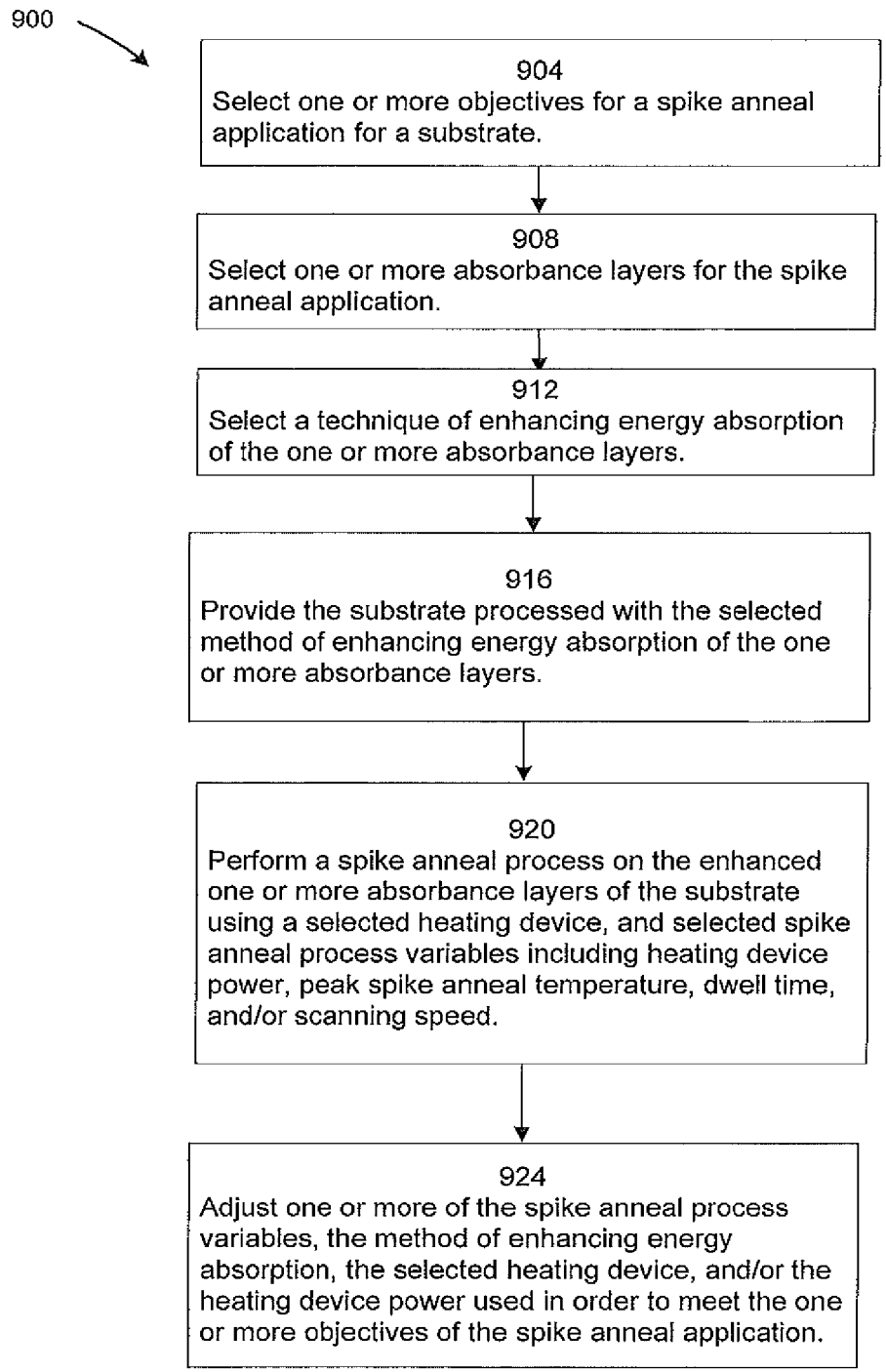
FIG. 9 is an exemplary flow chart of a method of performing a spike anneal application in an embodiment of the present invention.

FIG. 9 is an exemplary flow chart 900 of a method of performing a spike anneal application in an embodiment of the present invention. In operation 904, one or more objectives of the spike anneal application are selected. The one or more objectives can include peak temperature, dwell time, one or more heating device operating variables, normalized cost of ownership, scan speed, acid diffusion, thermal quench rate or two or more thereof. For example, the peak temperature can be a range of 200° C. to 450° C., the dwell time can be a range of 0.2 μs to 200 milliseconds, the heating device can be a laser device and the laser wavelength can be a range of 375 nm to 2680 nm, the scan speed can be a range of 1 mm/s to 2,000 mm/s, the acid diffusion can be less than 10 nm or less than 6 nm, the thermal quench rate can be a range of $10^{4\circ}$ C./s to $10^{-5\circ}$ C./s. The cost-of-ownership range can be normalized to the CO$_2$ laser spike anneal (CO$_2$LSA) cost and expressed as multiples or fractions of the CO$_2$LSA such as 10.CO$_2$LSA to 20.CO$_2$LSA or 0.5.CO$_2$LSA to 1.0.CO$_2$LSA depending on the heating device. The one or more objectives can also be expressed as an upper or lower limit, for example, the peak temperature can be less than 350° C., the dwell time can be less than 1 millisecond, the wavelength can be less than 2680 nm, the scan speed can be less than 400 mm/s, the acid diffusion can be less than 10 nm, and the thermal quench rate can be greater than $10^{-5\circ}$ C./s. Similarly, for example, the cost-of-ownership can be less than 1.5.CO$_2$LSA cost.

In operation 908, one or more absorbance layers are selected for the spike anneal application. As mentioned above, organic BARC, SiARC, OPL, UL, resist, TARC, or a sacrificial layer can be selected as the absorbance layer. In other embodiments, the resist and the TARC, a TARC and sacrificial layer, or the resist and a layer above or below the resist are selected as the absorbance layers. The selection of the one or more layers depend on the specific requirements of the spike anneal application. In operation 912, a technique of modifying absorption of the one or more selected absorbance layers is selected. Modification of absorption techniques include changing the material of the absorbance layer(s) such as using a different polymer or compound. Another technique includes coating an absorbance layer with another layer or thin film that enhances the absorption characteristics. The thin film or material can be placed below or on top of the absorbance layer or integrated into the material of the absorbance layer. For example, a dye can be added to the absorbance layer. Exemplary dyes can be found on lists in the Internet such as the one on http://www.sigmaaldriach.com/materials-science/material-science-products.html?TablePage=9540639. Other compounds that have similar effect as dyes are also available. In another embodiment, a variety of modification techniques are used such as using a different resist or different material for the absorbance layer, and/or using a sacrificial layer. Selection of the technique for modifying absorption of the one or more selected absorbance layers is based on historical data for similar spike anneal applications and the one or more selected objectives.

In operation 916, the substrate with the modified one or more absorbance layers using the selected technique of modifying absorbance is provided. The fabrication process of generating a silicon layer, an organic BARC, a SiARC, an OPL, an UL, a resist, a TARC or a sacrificial layer are known to people in the art. In operation 920, a spike anneal process on the modified one or more absorbance layers of the substrate is performed using a selected heating device, for example a laser or other light based device and selected spike anneal process variables including heating device operating variable, power, peak spike anneal temperature, dwell time, and scanning speed. The sequence of the following steps can be altered and still reach the same results, i.e., providing a substrate with the modified one or more absorbance layers. In one embodiment, the heating device is a laser or other light based device, the wavelength of the heating device is selected based on the one or more selected spike anneal objectives, one or more selected absorbance layers, and the selected method of modifying absorption of the one or more absorbance layers. Alternatively, a model can be used to simulate the temperature profile of the one or more absorbance layers as the wavelength of the light based device is changed. Some modeling software such as CLASP developed by Cornell University factors in the physics of a single scan where the proximity effect of the previous scan is not calculated. Other modeling software such as COMSOL Multiphysics, a finite element analysis, solver, and simulation software can be used to model the temperature profile of the absorbance layer with the change of wavelength. Other modeling approaches can also be used.

In an embodiment, if the heating device is selected to be a light based device, the wavelength is selected. The next step is selecting an appropriate laser or other light based device based on the selected wavelength. For example, a gas laser, such as a HeNe laser operating at 633 nm can be selected if the selected wavelength is about 633 nm. On the other end of the wavelength spectrum of 2700 nm to 2900 nm, a chemical laser, such as a hydrogen fluoride laser can be selected. For common wavelengths, a solid state laser device can be selected based on the requirements of the spike anneal application. For example, if the selected wavelength is 510 nm, a green diode laser device by Nichia Corporation from TOKUSHIMA 774-8601, JAPAN can be used. If the selected wavelength is 808 nm, a GaAlAs pumps in diode pumped solid state (DPSS) neodymium (Nd): yttrium aluminum garnet (YAG) laser can be used. Other lasers or other light based devices from other vendors can be used based on the selected wavelength and other operating characteristics. The selected laser or other light based device can be used to test the spike anneal system and compare actual values of the spike anneal variables to the ranges or values established in operation 904. If the ranges or values of the spike anneal parameters variables are not met, the process of selecting a heating device, selecting a wavelength, and selecting a specific model of a laser or other light based device are iterated until the ranges or values of the spike anneal process variables are met. Other lasers suitable as the heating device can include metal vapor laser, semiconductor laser, hydrogen fluoride laser, and helium-silver-metal vapor laser. For more data on types of lasers by wavelength, refer to HANDBOOK OF LASER WAVELENGTHS, edited by Weber, Marvin J., published by CRC Press, 1999, included herein in its entirety by reference.

Referring still to FIG. 9 operation 920, the spike anneal process on the modified one or more absorbance layers using the selected laser, or other light based device and selected anneal process variables including laser or other light based power, laser or other light based beam width, peak spike anneal temperature, dwell time, and scanning speed is performed. As mentioned above, the peak temperature can be in a range of 200° C. to 450° C., the dwell time can be a range of 0.2 µs to 200 milliseconds, and the scan speed can be in a range of 1 mm/s to 2,000 mm/s. The anneal process variables can also be expressed as an upper or lower limit, for example, the peak temperature can be less than 350° C., the dwell time can be less than 1 millisecond, the scan speed can be less than 400 mm/s. In operation 924, one or more of the spike anneal process variables, the method of modifying energy absorption of the one or more absorbance layers, the selected heating device such a laser or other light based device, and/or wavelength are adjusted or modified or replaced in order to meet the one or more objectives of the spike anneal application.

Figure 10:
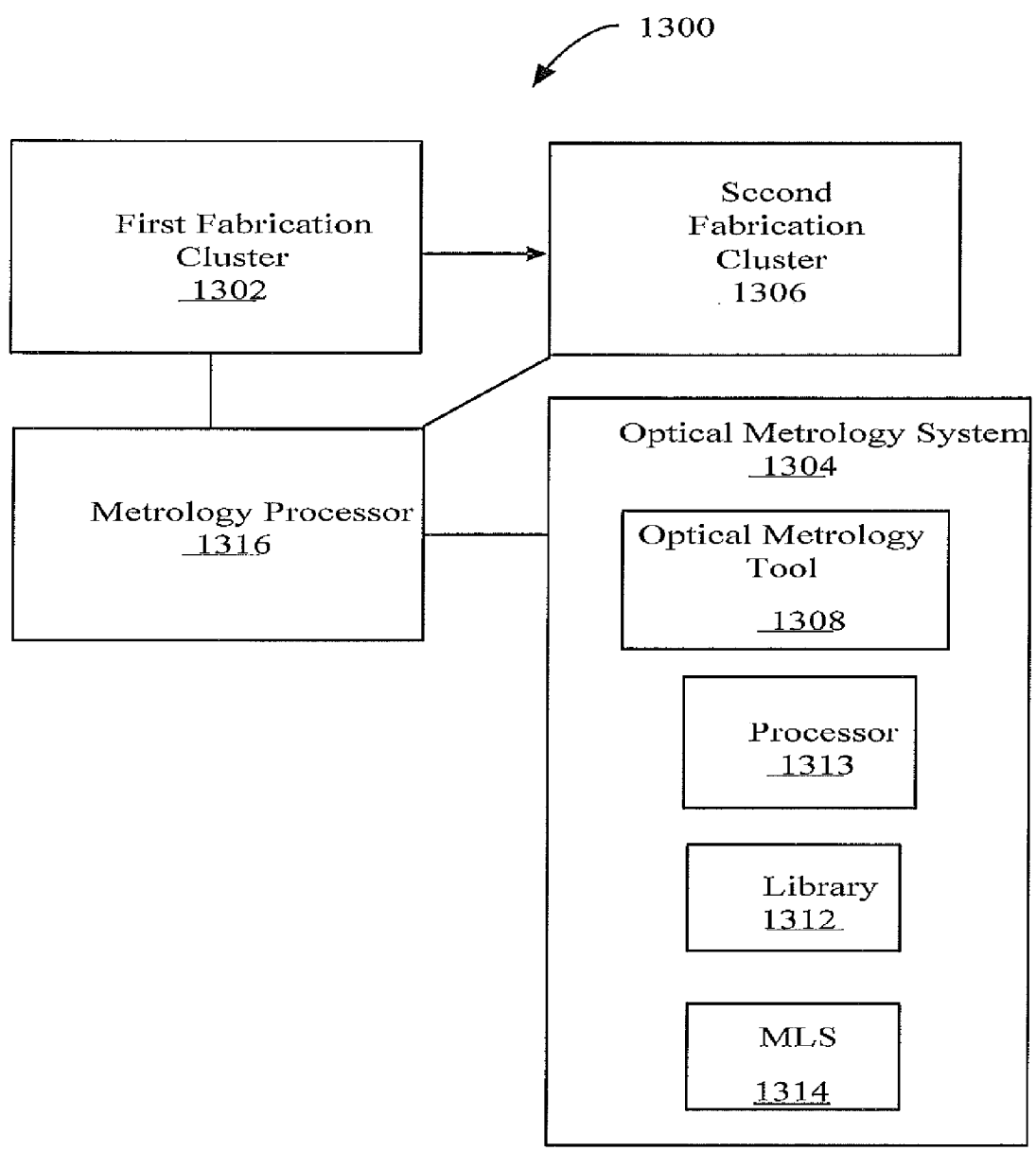
FIG. 10 is an exemplary block diagram of a system for determining and utilizing profile parameters of a structure on a substrate during or after spike anneal processing where the profile parameter values are used for automated process and equipment control.

FIG. 10 is an exemplary block diagram of a system 1300 for determining and utilizing profile parameters of a structure on a substrate such as the layers of the spike anneal application during or after laser, or other light based, spike anneal processing where the profile parameter values are used for automated process and equipment control. System 1300 includes a first fabrication cluster 1302 and optical metrology system 1304. System 1300 also includes a second fabrication cluster 1306. For details of an optical metrology system used to determine profile parameters of a structure on a substrate, refer to U.S. Pat. No. 6,943,900, titled GENERATION OF A LIBRARY OF PERIODIC GRATING DIFFRACTION SIGNALS, issued on Sep. 13, 2005, which is incorporated herein by reference in its entirety. Although the second fabrication cluster 1306 is depicted in FIG. 10 as being subsequent to first fabrication cluster 1302, it should be recognized that second fabrication cluster 1306 can be located prior to first fabrication cluster 1302 in system 1300, for example, in the manufacturing process flow.

A photolithographic process, such as exposing, developing a photoresist layer applied to a substrate, rapid thermal annealing, and/or laser, or other light based, spike annealing can be performed using first fabrication cluster 1302. In one exemplary embodiment, optical metrology system 1304 includes an optical metrology tool 1308 and processor 1310. Optical metrology tool 1308 is configured to measure a diffraction signal off the structure. Processor 1313 is configured to use the measured diffraction signal measured by the optical metrology tool and adjust using a signal adjuster, generating an adjusted metrology output signal. Furthermore, processor 1313 is configured to compare the adjusted metrology output signal to the simulated diffraction signal. As mentioned above, the simulated diffraction is determined using an optical metrology tool model using ray tracing, a set of profile parameters of the structure and numerical analysis based on the Maxwell equations of electromagnetic diffraction. In one exemplary embodiment, optical metrology system 1304 can also include a library 1312 with a plurality of simulated diffraction signals and a plurality of values of one or more profile parameters associated with the plurality of simulated diffraction signals. As described above, the library can be generated in advance; metrology processor 1316 can compare an adjusted metrology output signal to the plurality of simulated diffraction signals in the library. When a matching simulated diffraction signal is found, the one or more values of the profile parameters associated with the matching simulated diffraction signal in the library is assumed to be the one or more values of the profile parameters used in the substrate application to fabricate the structure.

System 1300 also includes a metrology processor 1316. In one exemplary embodiment, processor 1313 can transmit the one or more values of the one or more profile parameters to metrology processor 1316. Metrology processor 1316 can then adjust one or more process parameters or equipment settings of the first fabrication cluster 1302 based on the one or more values of the one or more profile parameters determined using optical metrology system 1304. Metrology processor 1316 can also adjust one or more process parameters or equipment settings of the second fabrication cluster 1306 based on the one or more values of the one or more profile parameters determined using optical metrology system 1304. As noted above, second fabrication cluster 1306 can process the substrate before or after fabrication cluster 1302. In another exemplary embodiment, processor 1313 is configured to train machine learning system 1314 using the set of measured diffraction signals as inputs to machine learning system 1314 and profile parameters as the expected outputs of machine learning system 1314.

In another embodiment, the metrology processor 1316 receives one or more sensor measurement signals from the first fabrication cluster 1302. The sensor measurement signals can be from a processing system and can include the spike anneal process variables including peak temperature dwell time, laser, or other light based, power or the like. The sensor measurement signals by itself or in conjunction with the optical metrology signals can be used by the metrology processor 1316 to determine one or more profile parameters of the substrate absorbance layer. Metrology processor 1316 can then adjust one or more process parameters or equipment settings of the first fabrication cluster 1302 or the second fabrication cluster 1306 based on the one or more values of the one or more profile parameters determined using the sensor measurement signals and/or in conjunction with the one or more profile parameters determined using optical metrology system 1304.

Figure 11:
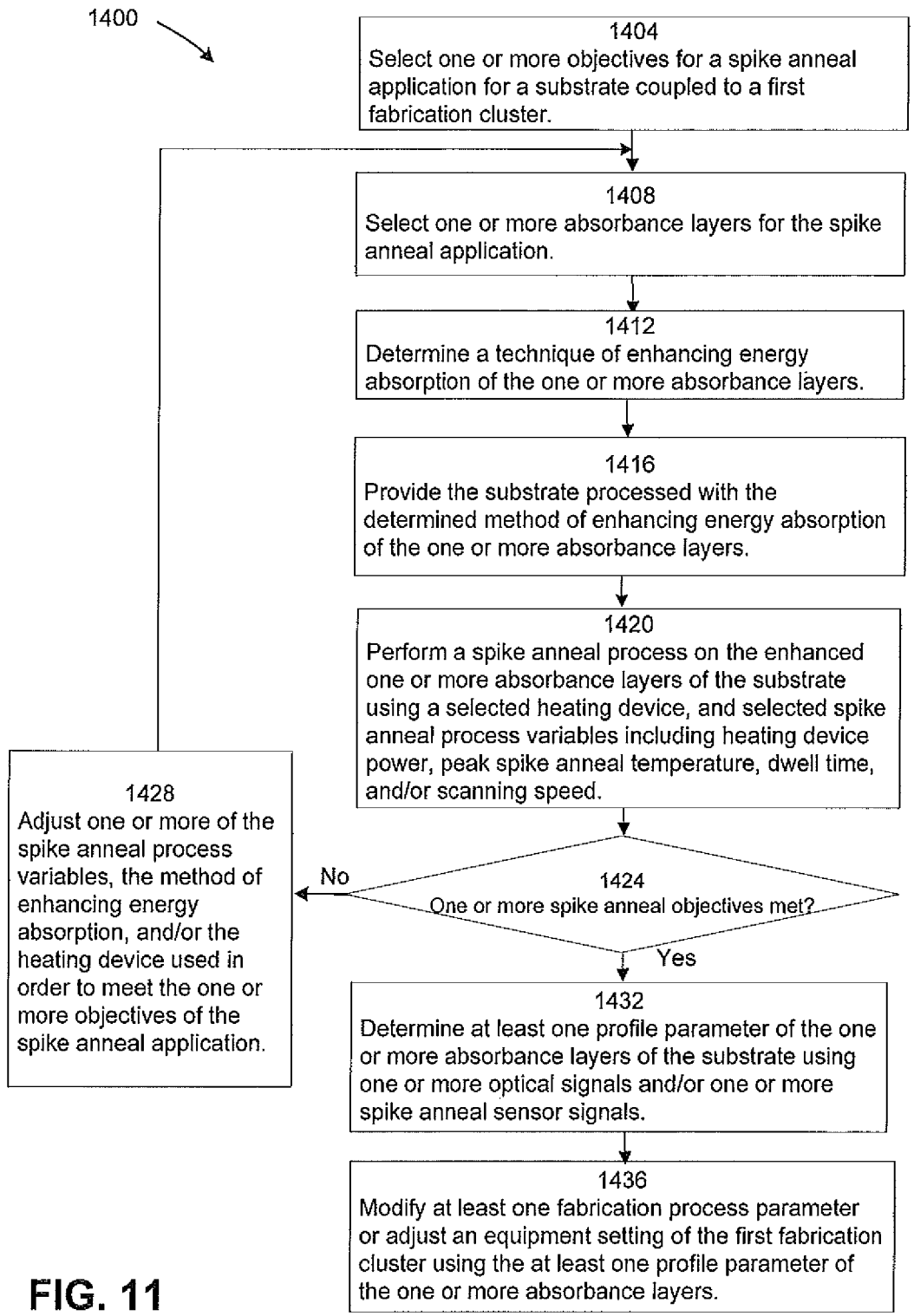
FIG. 11 is an exemplary flowchart of a method for controlling a fabrication cluster in a spike anneal processing of a substrate in a first fabrication cluster.

FIG. 11 is an exemplary flowchart 1400 of a method for controlling a fabrication cluster in a spike anneal processing of a substrate in a first fabrication cluster. In operation 1404, one or more objectives of the spike anneal application are selected. The one or more objectives can include peak temperature, dwell time, laser or other light based wavelength, normalized cost of ownership, scan speed, acid diffusion, thermal quench rate or two or more thereof. For example, the peak temperature can be a range of 200° C. to 450° C. or a range of 450° C. to 1050° C., the dwell time can be a range of 0.2 µs to 200 milliseconds, laser, or other light based, wavelength can be a range of 375 nm to 2680 nm, the scan speed can be a range of 1 mm/s to 2,000 mm/s, the acid diffusion can be less than 10 nm or less than 6 nm, and the thermal quench rate can be a range of $10^{-4\circ}$ C./s to $10^{-5\circ}$ C./s. The cost-of-ownership range can be normalized to the $CO_2$ laser spike anneal ($CO_2$LSA) cost and expressed as multiples or fractions of the $CO_2$LSA such as 10.$CO_2$LSA to 20.$CO_2$LSA or 0.5.$CO_2$LSA to 1.0.$CO_2$LSA depending on the laser or other light based device. The one or more objectives can also be expressed as an upper or lower limit, for example, the peak temperature can be less than 350° C., the dwell time can be less than 1 millisecond, the laser, or other light based, wavelength can be less than 2680 nm, the scan speed can be less than 400 mm/s, the acid diffusion can be less than 10 nm, and the thermal quench rate can be greater than $10^{-5\circ}$ C./s. Similarly, for example, the cost-of-ownership can be less than 1.5.$CO_2$LSA cost.

In operation 1408, one or more absorbance layers are selected for the spike anneal application. As mentioned above, the BARC, resist, TARC, or a sacrificial layer can be selected as the absorbance layer. In other embodiments, the resist and the TARC, or a TARC and sacrificial layer are selected as the absorbance layers. The selection of the one or more layers depend on the specific requirements of the spike anneal application. In operation 1412, a technique of modifying absorption of the one or more selected absorbance layers is selected. Modification of absorption techniques include changing the material of the absorbance layer(s) such as using a different polymer or compound. Another technique includes coating an absorbance layer with another layer or thin film that enhances the absorption characteristics. The thin film or material can be placed below or on top of the absorbance layer or integrated into the material of the absorbance layer. For example, a dye can be added to the absorbance layer. The potential dyes can be found on lists in the Internet such as the one on http://www.sigmaaldriach.com/materials-science/material-science-products.html?TablePage=9540639. Other compounds that have similar effect as dyes are also available. In another embodiment, a variety of modification techniques are used such as using a different resist or different material for the absorbance layer, and/or using a sacrificial layer. Selection of the technique for the technique of modifying absorption of the one or more selected absorbance layers is based on historical data for similar spike anneal applications and the one or more selected objectives.

In operation 1416, the substrate with the modified one or more absorbance layer using the selected technique of modifying absorbance is provided. The fabrication process of generating a silicon layer, an organic BARC, a SiARC, an OPL, a UL, a resist, a TARC or a sacrificial layer are known to people in the art. The sequence of the following steps can be altered and still reach the same results, i.e., providing a substrate with the modified one or more absorbance layers. In an embodiment, a laser or other light based device wavelength is selected based on the one or more selected spike anneal objectives, one or more selected absorbance layers, and the selected method of modifying energy absorption of the one or more absorbance layers. Alternatively, a model can be used to simulate the temperature profile of the one or more absorbance layers as the wavelength of the layer is changed. Some modeling software such as CLASP developed by Cornell University factors in the physics of a single scan where the proximity effect of the previous scan is not calculated. Other modeling software such as COMSOL Multiphysics, a finite element analysis, solver, and simulation software can be used to model the temperature profile with the change of wavelength. Other modeling approaches can also be used.

With a first laser, or other light based device wavelength selected, the next step is selecting an appropriate laser, or other light based, device based on the determined wavelength. For example, a gas laser, such as a HeNe laser operating at 633 nm can be selected if the selected wavelength is about 633 nm. On the other end of the wavelength spectrum of 2700 nm to 2900 nm, a chemical laser, such as a hydrogen fluoride laser can be selected. For common wavelengths, a solid state laser device can be selected based on the requirements of the spike anneal application. For example, if the laser wavelength is 510 nm, a green diode laser device by Nichia Corporation from TOKUSHIMA 774-8601, JAPAN can be used. If the laser wavelength is 808 nm, a GaAlAs pumps in diode pumped solid state (DPSS) neodymium (Nd): yttrium aluminum garnet (YAG) laser can be used. Other laser devices are selected based on the wavelength desired. The heating device, such as a laser or other light based device selected can be used to test the spike anneal system and compare actual values of the spike anneal variables to the ranges or values established in operation 1404. If the ranges or values are not met, the process of selecting or determining a wavelength and selecting a laser, or other light based device are iterated until the ranges or values of spike anneal parameters variables are met.

Referring still to FIG. 11, in operation 1420, the spike anneal process on the modified one or more absorbance layers using the selected laser, or other light based device and selected anneal process variables including laser power, laser beam width, peak spike anneal temperature, dwell time, and laser, or other light based, scanning speed is performed. As mentioned above, the peak temperature can be 200° C. to 450° C. or a range of 450° C. to 1050° C., the dwell time can be a range of 0.2 μs to 200 milliseconds, and the scan speed can be 1 mm/s to 2,000 mm/s. The anneal process variables can also be expressed as an upper or lower limit, for example, the peak temperature can be not greater than 350° C., the dwell time can be not greater 1 millisecond, and the scan speed can be less than 400 mm/s.

In operation 1424, the one or more calculated values of the laser, or other light based, spike anneal objectives are compared to the ranges or values of the laser, or other light based, spike anneal objectives. If not met, in operation 1428, one or more of the spike anneal process variables, the technique of modifying energy absorption of the one or more absorbance layers, the one or more laser, or other light based device wavelengths, and/or the selected laser, or other light based device are adjusted or modified or replaced in order to meet the one or more objectives of the spike anneal application. If the one or more laser, or other light based device spike anneal objectives are met, in operation 1432, at least one profile parameter of the one or more absorbance layers in the substrate using the one or more optical signals and/or one or more spike anneal sensor signals is determined. In operation 1436, at least one fabrication process parameter is modified or an equipment setting of the first fabrication cluster is adjusted using the at least one profile parameter of the one or more absorbance layers.

Referring to FIG. 3B, the controller 346 can be used to control the laser or other light based device spike anneal system. A program stored in the memory of the controller can be utilized to activate the inputs to the aforementioned components of the laser spike anneal system according to a process recipe in order to perform the method of laser spike anneal to achieve the selected one or more objectives. One example of controller 1090 is a DELL PRECISION WORKSTATION 610™, available from Dell Corporation, Austin, Tex. A controller can be locally located relative to the spike anneal system or it can be remotely located relative to the spike anneal system, via an internet or intranet. Thus, the controller can exchange data with the laser spike anneal system, using at least one of a direct connection, an intranet, or the internet. The controller can be coupled to an intranet at a customer site (i.e., a device maker, etc.), or coupled to an intranet at a vendor site (i.e., an equipment manufacturer). Furthermore, another computer (i.e., controller, server, etc.) can access the controller of the laser spike anneal system to exchange data via at least one of a direct connection, an intranet, or the internet.

Although exemplary embodiments have been described, various modifications can be made without departing from the spirit and/or scope of the present invention. For example, the invention was illustrated and described utilizing laser spike anneal on a substrate. Other layers or structures on a substrate can be processed using the same methods and systems described in the specification. Therefore, the present invention should not be construed as being limited to the specific forms shown in the drawings and described above. Accordingly, all such modifications are intended to be included within the scope of this invention.

What is claimed:

1. A method of controlling a spike anneal process on a substrate, comprising:
   selecting one or more objectives for a spike anneal application directed to a substrate having a photolithography stack formed thereon, the photolithography stack including a resist layer, one or more layers underneath the resist layer selected from a bottom anti-reflective coating (BARC), a Si-containing anti-reflective coating (SiARC), an organic planarization layer (OPL), and an underlayer (UL), and optionally one or more layers above the resist layer selected from a top anti-reflective coating (TARC) and a sacrificial layer;
   selecting one or more absorbance layers for the spike anneal application from the photolithography stack;
   selecting a technique for modifying absorption of the selected one or more absorbance layers to have a standard absorption or no absorption at a first wavelength critical for a lithography process to be performed on the substrate and high absorption at one or more secondary wavelengths different than the first wavelength;
   selecting a process wavelength and a heating device operable at the process wavelength for performing the spike anneal process, wherein the process wavelength is selected from the one or more secondary wavelengths;
   providing the substrate with the modified one or more absorbance layers;
   performing a spike anneal process on the substrate with the modified one or more absorbance layers using the heating device at the process wavelength and using selected spike anneal process variables; and
   adjusting one or more of the spike anneal process variables, the selected technique for modifying absorption, the selected process wavelength, and/or the selected heating device in order to meet the one or more objectives of the spike anneal application.

2. The method of claim 1 wherein the one or more objectives include one or more of a peak temperature, a dwell time, the one or more second wavelengths, normalized cost of ownership, scan speed, acid diffusion, and/or thermal quench rate of the spike anneal application.

3. The method of claim 2 wherein the peak temperature is in a range of 200° C. to 450° C.

4. The method of claim 2 wherein the dwell time is in a range of 0.2 μs to 200 ms.

5. The method of claim 2 wherein the one or more second wavelengths is in a range of 375 nm to 2680 nm.

6. The method of claim 2 wherein the normalized cost of ownership is less than $1.5.CO_2$ laser spike anneal (LSA) cost.

7. The method of claim 2 wherein the scan speed is in a range of 1 mm/s to 2,000 mm/s.

8. The method of claim 2 wherein the acid diffusion is less than 10 nm.

9. The method of claim 2, wherein the thermal quench rate is in a range of $10^{-4}$° C./s to $10^{-5}$° C./s.

10. The method of claim 1 wherein selecting a process wavelength and a heating device further comprises selecting a laser or other light based device as the heating device.

11. The method of claim 10 wherein the laser device is a gas laser, a chemical laser, a metal vapor laser, a solid-state laser, or a semiconductor laser.

12. The method of claim 11 wherein the gas laser is a helium-neon laser, the chemical laser can be is a hydrogen fluoride laser, metal vapor laser can be is a helium-silver-metal vapor laser, and the solid-state laser can be is a neodymium yttrium aluminum garnet laser.

13. The method of claim 10 wherein the wavelength used in the laser device is selected by using a modeling software to simulate the temperature profile of the one or more absorbance layers in a spike anneal process as the wavelength of the laser device is changed.

14. The method of claim 1 wherein the technique of modifying absorption of the selected one or more absorbance layers includes changing materials used for the one or more absorbance layers or coating the one or more absorbance layers with a dye or a compound, wherein the changed material, the dye or the compound is highly absorbing at the one or more second wavelengths.

15. The method of claim 1 further comprising:
   determining at least one profile parameter of the one or more absorbance layers of the substrate using one or more optical metrology signals and/or one or more spike anneal sensor signals; and
   modifying at least one fabrication process parameter or adjusting an equipment setting of a first fabrication cluster using the at least one profile parameter of the one or more absorbance layers.

16. The method of claim 1 further comprising:
   determining at least one profile parameter of the one or more absorbance layers of the substrate using one or more optical metrology signals and/or one or more spike anneal sensor signals; and
   modifying at least one fabrication process parameter or adjusting an equipment setting of a second fabrication cluster using the at least one profile parameter of the one or more absorbance layers.

17. The method of claim 1 further comprising:
   determining at least one profile parameter of the one or more absorbance layers of the substrate using one or more optical metrology signals and/or one or more spike anneal sensor signals;
   modifying at least one fabrication process parameter or adjusting an equipment setting of a first fabrication cluster using the at least one profile parameter of the one or more absorbance layers; and
   modifying at least one fabrication process parameter or adjusting an equipment setting of a second fabrication cluster using the at least one profile parameter of the one or more absorbance layers.

18. The method of claim 1 wherein the heating device is a laser, a flash lamp, an arc lamp, or a light-emitting diode (LED) device.

19. The method of claim 1 wherein the process wavelength used in the heating device is selected by using a modeling software to simulate the temperature profile of the one or more absorbance layers in the spike anneal process as the wavelength of the heating device is changed.

* * * * *

UNITED STATES PATENT AND TRADEMARK OFFICE
CERTIFICATE OF CORRECTION

Page 1 of 2

PATENT NO. : 9,085,045 B2
APPLICATION NO. : 13/662524
DATED : July 21, 2015
INVENTOR(S) : Scheer et al.

It is certified that error appears in the above-identified patent and that said Letters Patent is hereby corrected as shown below:

IN THE SPECIFICATION:

Col. 6, line 28, "to the an ending" should read --to the ending--.

Col. 8, line 13, "1. where I is" should read --where 1. I is--.

Col. 8, line 15, "1. $I_0$ is" should read --2. $I_0$ is--.

Col. 8, line 17, "2. α is" should read --3. α is--.

Col. 8, line 19, "3. x is" should read --4. x is--.

Col. 9, line 54, "10.$CO_2$LSA to 20.$CO_2$LSA or 0.5.$CO_2$LSA to 1.0.$CO_2$LSA" should read --10•$CO_2$LSA to 20•$CO_2$LSA or 0.5•$CO_2$LSA to 1.0•$CO_2$LSA--.

Col. 9, line 62, "1.5.$CO_2$LSA cost." should read --1.5•$CO_2$LSA cost--.

Col. 10, line 3, "layers depend on the" should read --layers depends on the--.

Col. 10, line 7, "include changing" should read --includes changing--.

Col. 10, line 29, "are known to" should read --is known to--.

Col. 10, line 67, "pumps in diode pumped" should read --pump in diode pumped--.

Col. 13, lines 6-7, "10.$CO_2$LSA to 20.$CO_2$LSA or 0.5.$CO_2$LSA to 1.0.$CO_2$LSA" should read --10•$CO_2$LSA to 20•$CO_2$LSA or 0.5•$CO_2$LSA to 1.0•$CO_2$LSA--.

Col. 13, line 16, "1.5.$CO_2$LSA cost." should read --1.5•$CO_2$LSA cost.--.

Signed and Sealed this
Nineteenth Day of January, 2016

Michelle K. Lee
*Director of the United States Patent and Trademark Office*

CERTIFICATE OF CORRECTION (continued)
U.S. Pat. No. 9,085,045 B2

IN THE SPECIFICATION:

Col. 13, line 23, "more layers depend" should read --more layers depends--.

Col. 13, line 27, "include changing" should read --includes changing--.

Col. 13, line 50, "are known to" should read --is known to--.

Col. 14, line 14, "pumps in diode pumped" should read --pump in diode pumped--.

Col. 14, line 21, "the process of selecting" should read --the processes of selecting--.

Col. 14, line 37, "not greater 1 millisecond," should read --not greater than 1 millisecond,--.

IN THE CLAIMS:

Col. 16, line 4, Claim 6, "1.5.$CO_2$ laser" should read --1.5•$CO_2$ laser--.

Col. 16, lines 18-20, Claim 12, "the chemical laser can be is a hydrogen fluoride laser, metal vapor laser can be is a helium-silver-metal vapor laser, and the solid-state laser can be is a neodymium yttrium aluminum garnet laser." should read --the chemical laser is a hydrogen fluoride laser, metal vapor laser is a helium-silver-metal vapor laser, and the solid-state laser is a neodymium yttrium aluminum garnet laser.--.